United States Patent [19]
Frankeny et al.

[11] Patent Number: 5,229,916
[45] Date of Patent: Jul. 20, 1993

[54] CHIP EDGE INTERCONNECT OVERLAY ELEMENT

[75] Inventors: Richard F. Frankeny, Austin; Ronald L. Imken, Round Rock, both of Tex.

[73] Assignee: International Business Machines Corporation, Armonk, N.Y.

[21] Appl. No.: 846,301

[22] Filed: Mar. 4, 1992

[51] Int. Cl.$^5$ .............................................. H05K 7/20
[52] U.S. Cl. ................... 361/386; 174/254; 174/268; 257/668; 257/712; 257/777; 361/398; 361/417; 361/419
[58] Field of Search ............. 165/80.3, 185, 16.3; 174/254, 268; 361/386–389, 398, 400, 403, 408, 410, 413, 417, 419, 420; 439/67–68, 77, 485, 487; 257/668, 684, 706, 712–713, 722–724, 734, 777–778

[56] References Cited

U.S. PATENT DOCUMENTS

| | | | |
|---|---|---|---|
| 3,766,439 | 10/1973 | Isaacson | 317/100 |
| 4,495,546 | 1/1985 | Nakamara et al. | 361/388 |
| 4,855,809 | 8/1989 | Malhi et al. | 357/75 |
| 4,858,071 | 8/1989 | Manabe et al. | 361/398 |
| 4,922,378 | 5/1990 | Malhi et al. | 361/387 |
| 4,982,264 | 1/1991 | Cragon et al. | 357/75 |
| 5,040,052 | 8/1991 | McDavid | 357/80 |
| 5,040,997 | 8/1991 | Garner | 439/77 |
| 5,050,039 | 9/1991 | Edfors | 361/388 |
| 5,059,557 | 10/1991 | Cragon et al. | 437/208 |

OTHER PUBLICATIONS

IBM TDB "Vertical Chip Packaging", vol. 20, No. 11A, Apr. 1978, pp. 4339–4340.
IBM TDB "Transmission Line Right Angle Connector", vol. 26, No. 12, May 1984, pp. 6592–6593.
IBM TDB "Concept for Forming Multilayer Structures for Electronic Packaging", vol. 30, No. 3, Aug. 1987, p. 1353.
IBM TDB "High Density Flexible Connector", vol. 32, No. 7, Dec. 1989, pp. 344–345.

Primary Examiner—Gregory D. Thompson
Attorney, Agent, or Firm—Mark E. McBurney

[57] ABSTRACT

A chip overlay element is formed of a flexible substrate of polymer having electrically conductive material applied to one side thereof and circuitized to form signal lines. A metal stiffener/heat spreader is laminated to the polymer on the opposite side of the conductor. I/Os are formed on one end of the signal lines of the circuitized layer (near the end of the overlay element) and interconnection pads, bumps, or the like are formed on the opposite end (near the center of the element). The metal stiffener is then etched to form three distinct areas. The chip edge is then placed on the center metal stiffener area and bonded, with the other two stiffener areas being bent around the chip and bonded to the corresponding chip sides. The original I/Os are then electrically connected to the I/Os formed on the signal lines of the overlay element.

15 Claims, 7 Drawing Sheets

CHIP EDGE INTERCONNECT OVERLAY ELEMENT

BACKGROUND OF THE INVENTION

1. Field of the Invention

This invention generally relates to connecting integrated circuit (IC) devices to a substrate within a computer system. In particular, an overlay element is provided such that the input/output (I/O) contact points on the chips can be rearranged, thereby allowing different interconnect configurations.

2. Description of Related Art

Generally, ICs are placed flat, i.e. the largest surface is placed on a planar board or circuit card. More specifically, the plane of the IC is parallel with the plane of the circuit card on which the chip is mounted. These integrated circuits are then electrically connected to the circuitry on the card by using known methods, such as wire bonding or direct chip attach (DCA) technology. Additionally packaged ICs such as surface mount technology (SMT) or pin-through-hole (PTH) chips are also placed flat on the printed circuit board and then electrically attached thereto.

Interconnect elements for attaching chips to substrates, or the like are also known. IBM Technical Disclosure Bulletin "Transmission Line Right Angle Connector" shows an interposer, having matching wiring, is disposed between perpendicular chip carriers. U.S. Pat. No. 5,050,039 describes a chip mounting arrangement wherein chips are attached, on one side, to a heat sink and the I/Os are connected to vertically disposed interconnect boards. A flex circuit is used to connect the interconnect boards to a motherboard.

Additionally, it is known to perpendicularly mount, with reference to a corresponding substrate, a plurality of chips in a support member, as shown in U.S. Pat. Nos. 4,982,264 and 5,059,557. In these arrangements electrical conductors are disposed in a surface of the support member to contact bonding pads located on the chips. Further, chips can be mounted perpendicularly with respect to a substrate in a "free standing" configuration. U.S. Pat. Nos. 4,922,378 and 5,031,072 describe a base plate having channels therein for supporting perpendicularly mounted integrated circuits. The ICs are electrically interconnected to the base plate through pads on the IC and base plate. The base plate and IC assembly is then electrically interconnected to an underlying planar surface by interconnecting a plurality of baseboard pads and connector pads. IBM Technical Disclosure Bulletin "Vertical Chip Packaging" discusses mounting chips perpendicularly on a substrate. The ICs are either placed in a channel in the substrate, or supported by a foil "foot" bonded to the back of the chip. The foot can also be used to supply electrical power to the chip. Foil "fingers" are then used to electrically interconnect the chip signal I/Os to the substrate. It can be seen that conventional perpendicular chip mounting requires placement of I/Os at a specific location on the chip. In the prior art, this placement of I/Os occurs at the chip fabrication level and requires custom made chips be acquired from chip manufacturers. Of course, a great deal of packaging flexibility is lost if specific chips must be special ordered from the manufacturer. Further, availability problems may also exist if standard "off the shelf" types of chips can not be purchased and used in the desired packaging configuration. Therefore, it would be advantageous to have a means of reconfiguring any type of chip to meet the desired packaging configuration.

SUMMARY OF THE INVENTION

In contrast to the prior art, the present invention is a chip overlay element that allows the electrical I/Os of a chip to be reconfigured. In this manner any available chip can be used in packaging applications that require a specific I/O pattern.

Broadly a flexible substrate is formed of polymer having electrically conductive material applied to one side and circuitized to form signal lines. A metal stiffener is laminated to the polymer on the opposite side of the conductor. The metal stiffener also acts as a heat spreader to transfer thermal energy away from the chip. I/Os are formed on one end of the signal lines of the circuitized layer (near the end of the overlay element) and interconnection pads, bumps, or the like are formed on the opposite end (near the center of the element). The metal stiffener is then etched to form three distinct areas. A first stiffener area is used as the heat spreader, the second is to reinforce the interconnection bumps and the third will be a back-up for the I/Os.

The chip edge is then placed on the interconnection area and bonded, with the other two stiffener areas being bent around the chip and bonded to the corresponding chip sides. The original I/Os are then electrically connected to the I/Os formed on the signal lines of the overlay element. The chip with overlay element is then capable of being interconnected to a circuit card, flexible substrate, or the like.

In accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
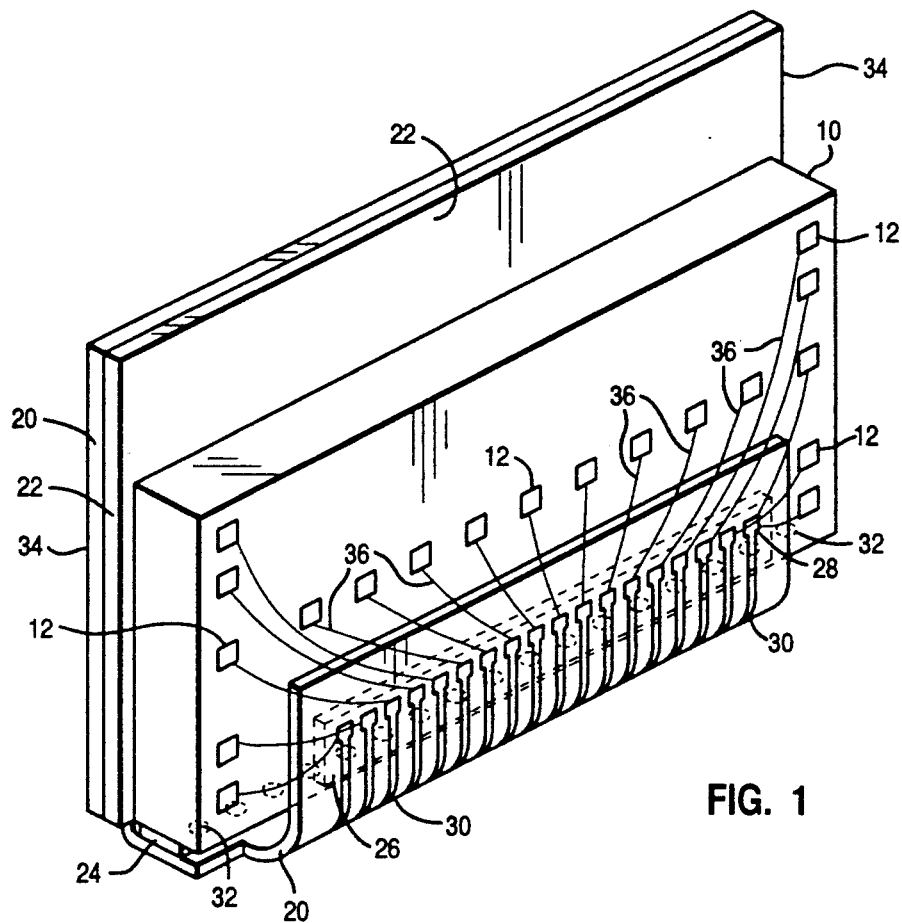
FIG. 1 is a perspective view of the chip and overlay element of a first embodiment of the present invention.

Referring to FIG. 1, a perspective view of the chip overlay element of the present invention is shown. An integrated circuit device 10 is shown having a plurality of electrical connection input/output pads 12 on a surface thereof. Chip 10 may be one of any number of commercially available ICs, such as dynamic random access memory (DRAM), static random access memory (SRAM) chips, as well as any number of logic chips, and the like. It should be noted that chip 10 is a standard unpackaged integrated circuit wherein I/Os 12 are formed on the chip in any number of different configurations and with different metallurgy thereon depending on the packaging application, e.g. wire bonding. No new processing is required during the fabrication of chip 10 in order for it to be compatible with the present invention.

Figure 8:
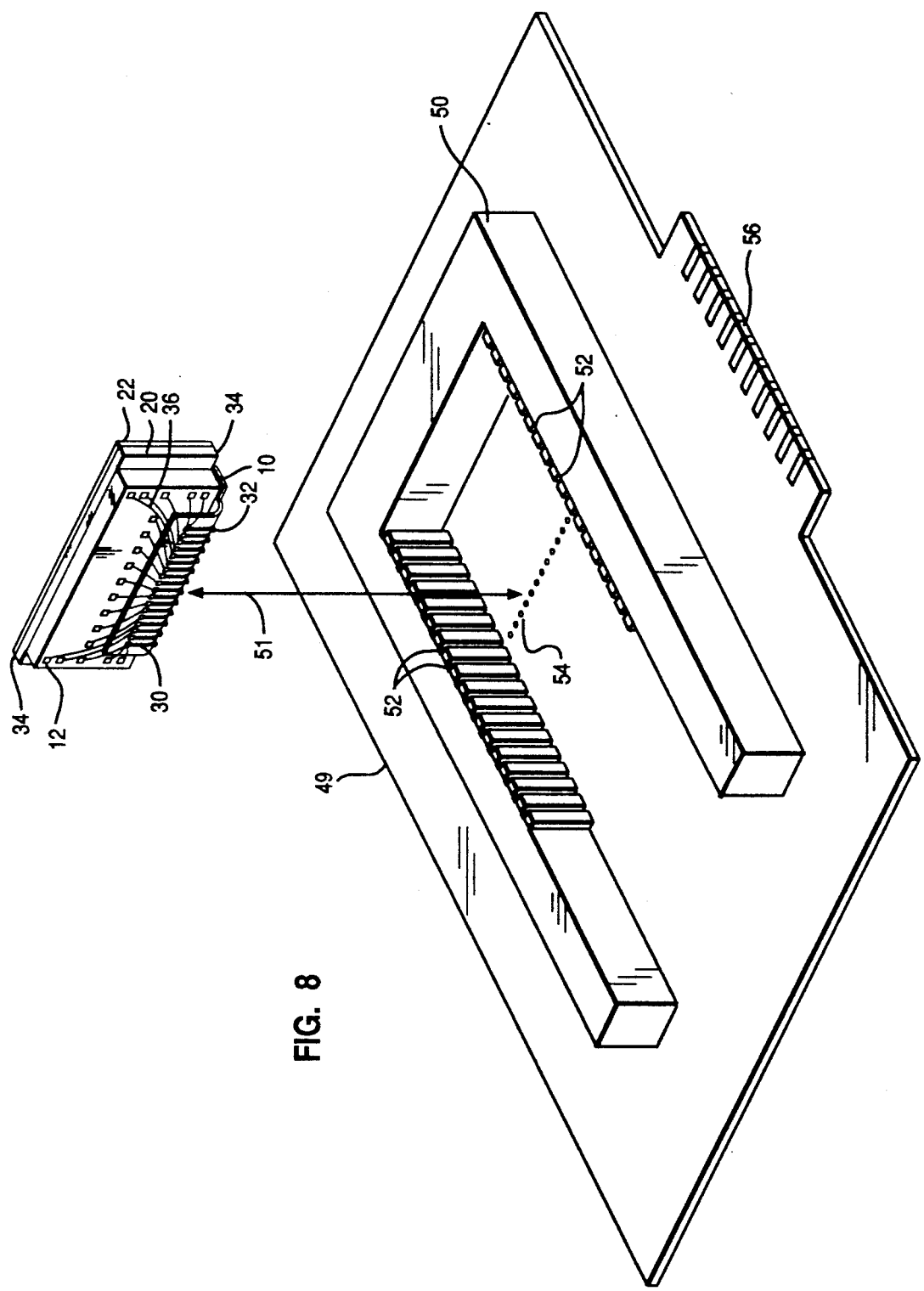
FIG. 8 illustrates how a chip with overlay element can be incorporated into a module for attachment to a circuit card.

The chip overlay element of the present invention includes a flexible substrate layer 20 having three distinct metal thereon. A heat spreader 22 that also functions as a stiffening element is shown adjacent the side of chip 10 opposite pads 12. Backup portions 24 is used for support of the overlay element I/O interconnection bumps 32. Similarly, backup portion 26 is used to support bonding pads 28. It can be seen that flexible substrate 20 with discrete metal portions 22, 24 and 26 can be bent around three sides of chip 10. It should be noted that heat spreader 22 and the adjacent portion of substrate 20 may form end portions 34 that extend past the ends of chip 10. This end portion 34 functions as a wing that will be used to insert the present invention in a mounting assembly, as shown in FIG. 8 and discussed in more detail below. Pads 28 and signal lines 30 are disposed on the surface of flexible substrate 20 opposite portions 24 and 26. Pads 28 are covered with a joining metallurgy, such as gold or nickel, by plating, sputtering or the like, to aid in the attachment of wires 36. Wires 36 are used to attach chip pads 12 with overlay element pads 28 using wire bonding technology as is known in the art. Signal lines 30 electrically interconnect pads 28 and I/O bumps 32 such that chip I/O pads 12 are electrically interconnected with overlay element I/O bumps 32, thereby effectively reconfiguring the I/O outputs of chip 10.

Figure 2:
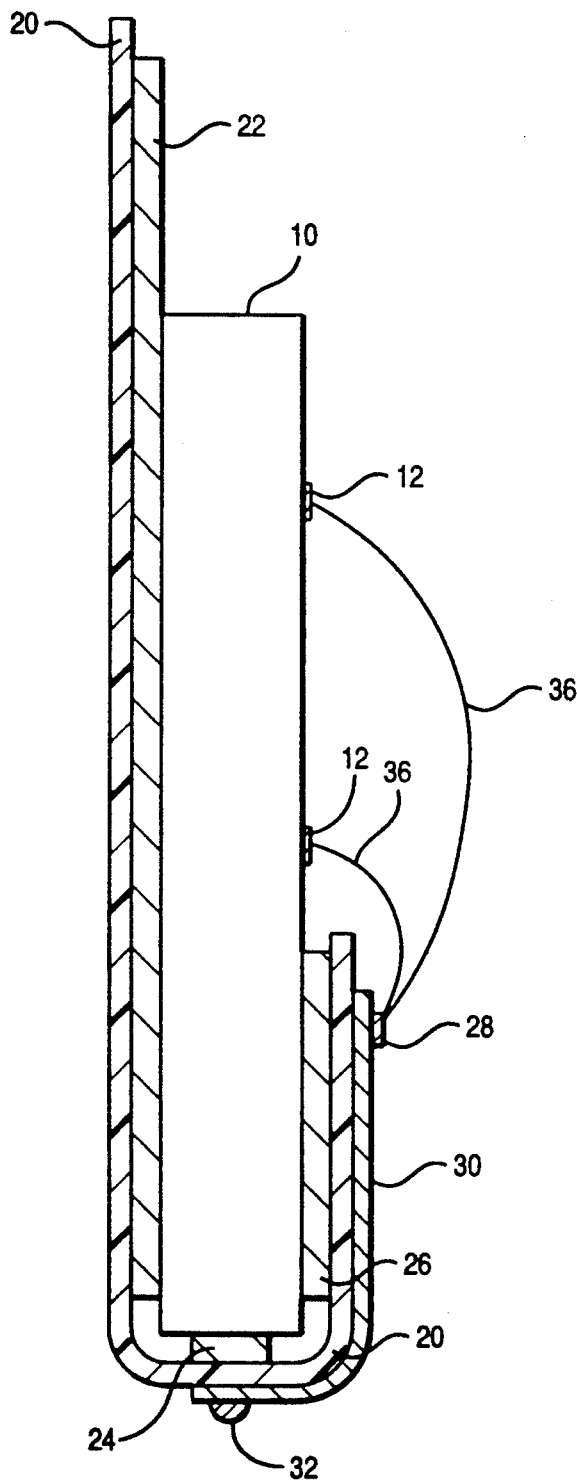
FIG. 2 is a plan view of the assembly of FIG. 1 wherein wirebonding is used to attach the chip and overlay I/Os.

FIG. 2 is a side view of the chip overlay element assembly of FIG. 1. Chip 10 is shown in abutting relation with heat spreader 22. Back-up portions 24 and 26 are also shown adjacent chip 10. It can be seen how portions 24 and 26 act as back-ups to I/Os 32 and pad 28, respectively. Flexible substrate 20 is shown bent around three sides of chip 10. Chip I/O pads 12 are shown wire bonded to overlay element pads 28 by wires 36. Circuit lines 30, formed on the outside of substrate 20 electrically interconnect pads 28 with overlay element I/Os 32. It should be noted that I/Os 32 would typically be configured as a controlled collapse chip connection (C4) interconnection point. It should be noted that pads 12 of chip 10 will often have a C4 type solder ball interconnect placed thereon such that chip 10 can be directly mounted on a circuit card, or the like. Thus, the utility of the present invention can be seen since conventional direct chip attach for IC 10 will require a larger amount of a circuit card to be covered, or displaced, than by edge mounting chip 10 having C4 interconnects disposed along the narrow edge thereof. Those skilled in this particular art will understand that C4 technology is well known and as such will not be described further herein.

Figure 6:
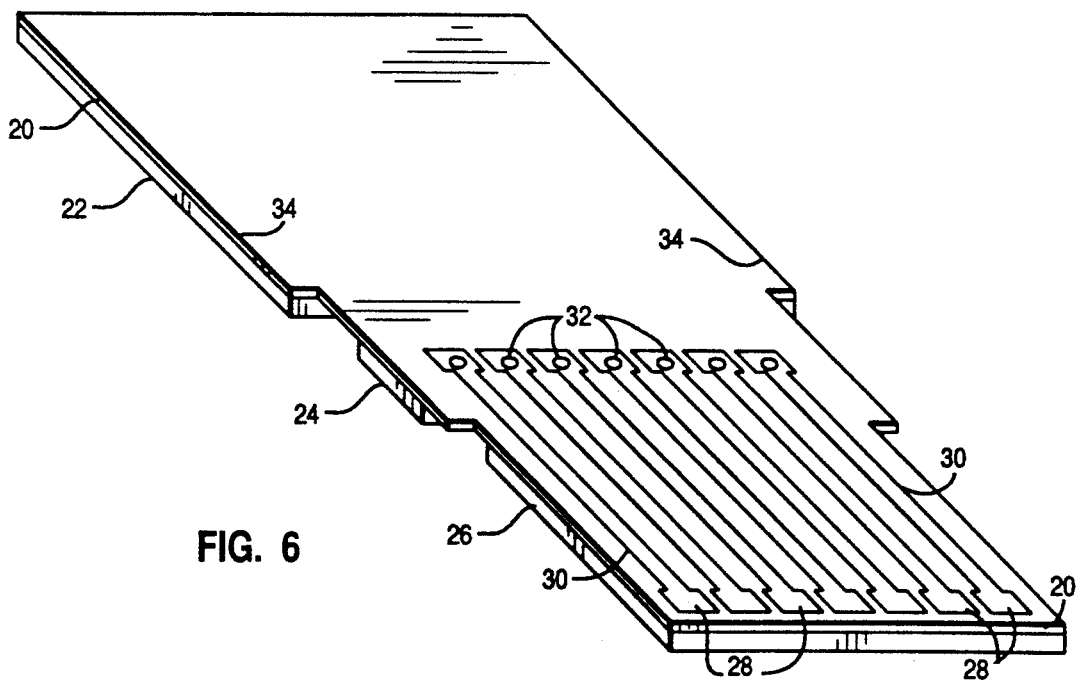
FIG. 6 is a perspective view of the overlay element prior to its attachment to the chip.
Figure 3:
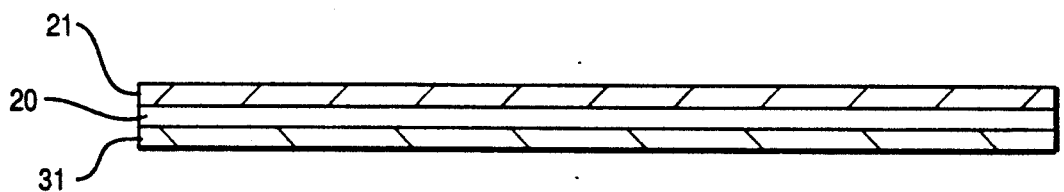
FIG. 3 shows the materials used to make the overlay element, prior to its fabrications.
Figure 4:
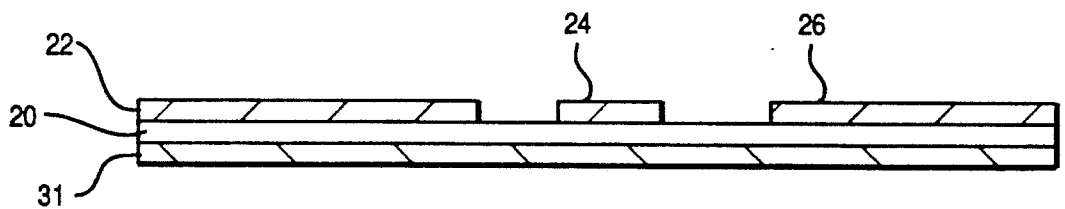
FIG. 4 illustrates a first step in the fabrication process of the overlay element of the present invention.
Figure 5:
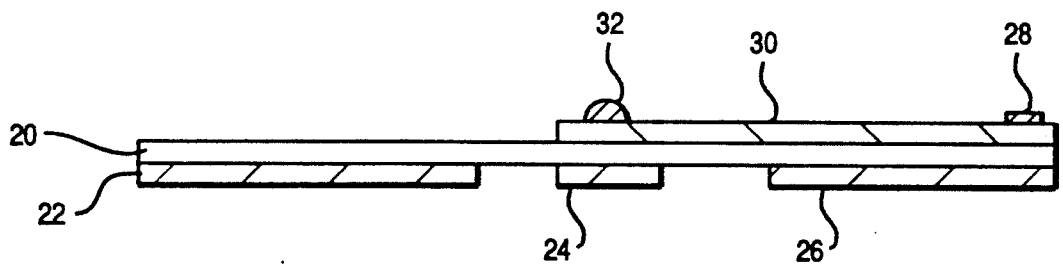
FIG. 5 is a crossectional view of the overlay element.

A description of the fabrication process for making the overlay element of the present invention will now be described with reference to FIGS. 3-5. A polymer film such as a polyimide material is used for the flexible substrate 20 as shown in FIG. 3. A metal stiffener layer 21 is then attached to one side of the flexible substrate 20 by lamination, bonding or the like. Metal stiffener 21 may be any one of several thermally conductive materials e.g. metals. A copper layer 31 is also placed adjacent substrate 20 on a side opposite stiffener layer 21 to form the substrate crossection shown in FIG. 3. Metal stiffener 21 is then etched, to form three distinct areas, i.e. heat spreader 22 and 24 and 26. Subsequent to forming the three distinct stiffening areas of layer 21, the copper layer 31 is etched to form circuit lines 30 as shown in FIGS. 5 and 6. Etching is a well known technique wherein caustic solutions are used to remove that portion of a material which is unnecessary such that the required portions remain. Subsequent to the circuitizing of lines 30 onto flexible substrate 20, joining metallurgy is placed near one end of the substrate assembly to form pads 28. C4 solder balls are then formed on substantially the opposite end of the circuitized signal lines 30. The joining metallurgy that will make up pads 28 may be gold or nickel and bumps 32 will likely be made from a tin/lead solder, or the like as is known in the art. Additionally, it should be noted that other techniques of forming circuitized signal lines 30 on the surface of flexible substrate 20 can be used to form the overlay element of the present invention. For example, pattern plating may be used wherein a conductive seed is sputtered on substrate layer 20 and circuit lines 30 are then selectively plated thereon in the desired locations through a dielectric mask. The dielectric mask is removed by washing, or the like and the seed conductor is subsequently removed by flash etching, thereby leaving circuit lines 30 in desired locations on the surface of flexible substrate 20.

FIG. 6 is a perspective view of the overlay element shown in FIG. 5, prior to its placement around an integrated circuit device 10. Flexible substrate 20 is shown having pads 28 and circuitized lines 30 formed thereon. Additionally, interconnection bumps 32 are shown electrically connected to pads 28 through lines 30. Heat spreader 22 and the back-ups portions 24 and 26 are also shown attached to flexible substrate 20. End portions 34 can be seen which will be used to connect and align the chip and overlay element assembly of the present invention, as described below.

Figure 7:
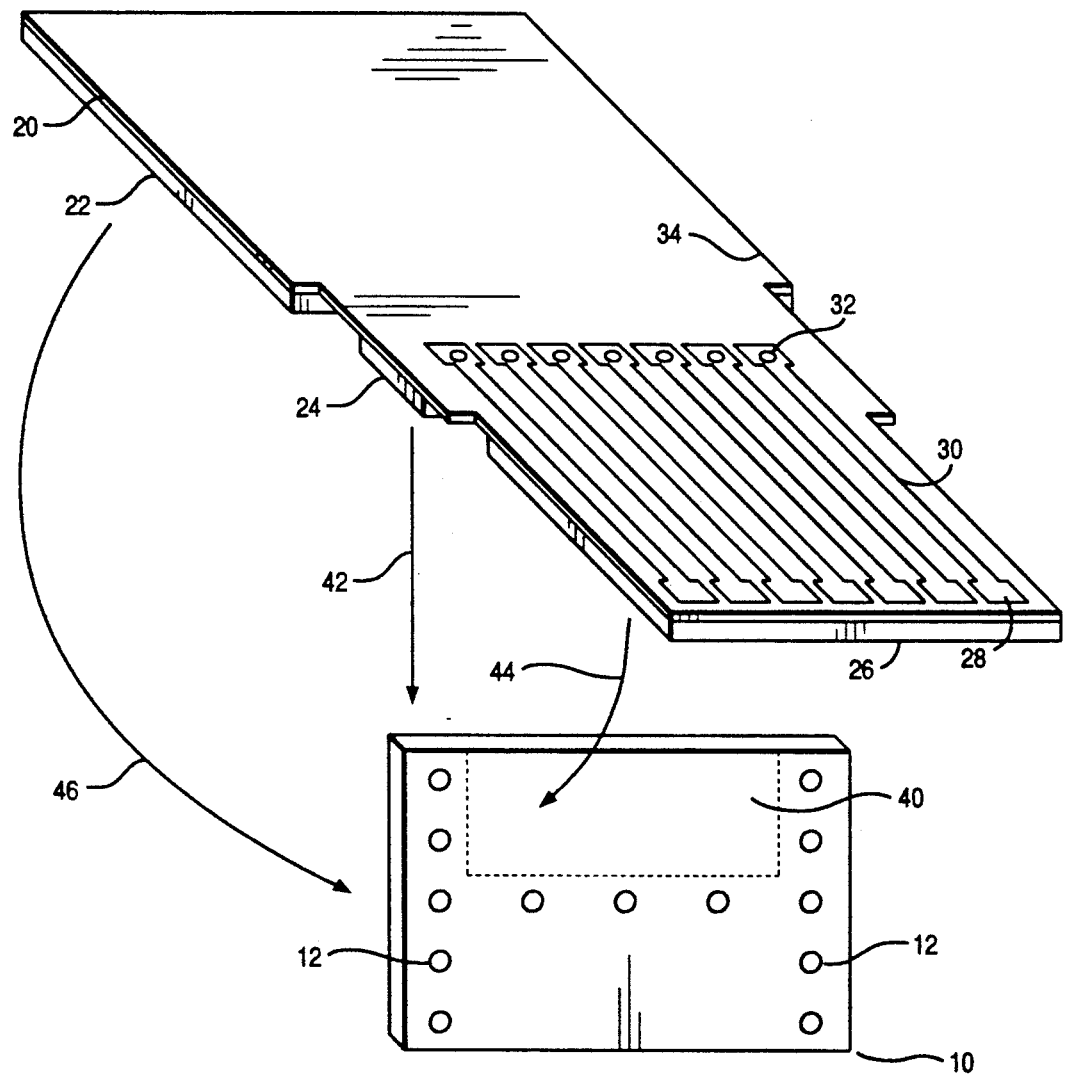
FIG. 7 is another perspective view of the overlay element of the present invention showing its attachment to a chip.

Placement of the chip overlay element of the present invention around an integrated circuit device will now be described with reference to FIG. 7. First, the C4 I/O back-up support 24 is placed along an edge of chip 10 as shown by arrow 42, and then bonded thereto by conventional means such as gluing, or the like. Subsequently, pad I/O back-up portions 26 is placed over portion 40 of chip 10, as shown by arrow 44, and bonded thereto. It should be noted that the width of the overlay element is designed so as not to cover any chip I/Os 12 and to directly correspond to area 40 of chip 10. Of course, the configuration of the overlay element of the present invention can be changed according to the configuration of I/Os on the chip 10 being used. During fabrication of the chip overlay element, the width thereof is regulated by cutting, stamping, or the like, an element having the desired dimensions from a sheet of substrate such as shown in FIGS. 3-5. Subsequent to bonding of the back-up portion 26 to chip 10 heat spreader portion 22 is then bent around adjacent to the side of chip 10 opposite pads 12 and bonded thereto, as shown by arrow 46. Pads 12 can then be electrically interconnected with pads 28 by techniques such as wire bonding, or the like. Thus, the assembly of an overlay element and IC is shown which effectively reconfigures the chip I/Os along a single edge, thereby enhancing connectability of the chip 10 in high density packaging applications, is shown. It should be noted that the bonding material may be chosen to electrically insulate supports 22, 24, 26 from the surface of chip 10 in order to prevent any potential electrical shorts from occurring between chip I/Os. Alternately, an electrically conductive bonding material could be used if the supports were to be used as a ground plane, or the like.

FIG. 8 is an application of the present invention wherein a circuit card 49 is shown with a high density packaging mounting assembly 50 affixed thereto. The chip and overlay element assemblies are held in place by the mounting assembly 50 when extended portions 34 of the overlay element are slid into corresponding grooved portions 52 of the chip mounting assembly 50 as shown by arrow 51. Interconnection pads 54 are formed on the surface of card 49 and are in electrical communication with connector 56 formed in card 49. Connection pads 54 will correspond with solder bumps 32 of the overlay element such that when card 49 is plugged into a computer printed circuit board, or the like, a central processing unit is capable of communicating with chip 10 through connector 56, card pads 54, solder bumps 32, signal lines 30, connection pads 28, wire bonded lines 36 and chip I/Os 12.

Figure 9:
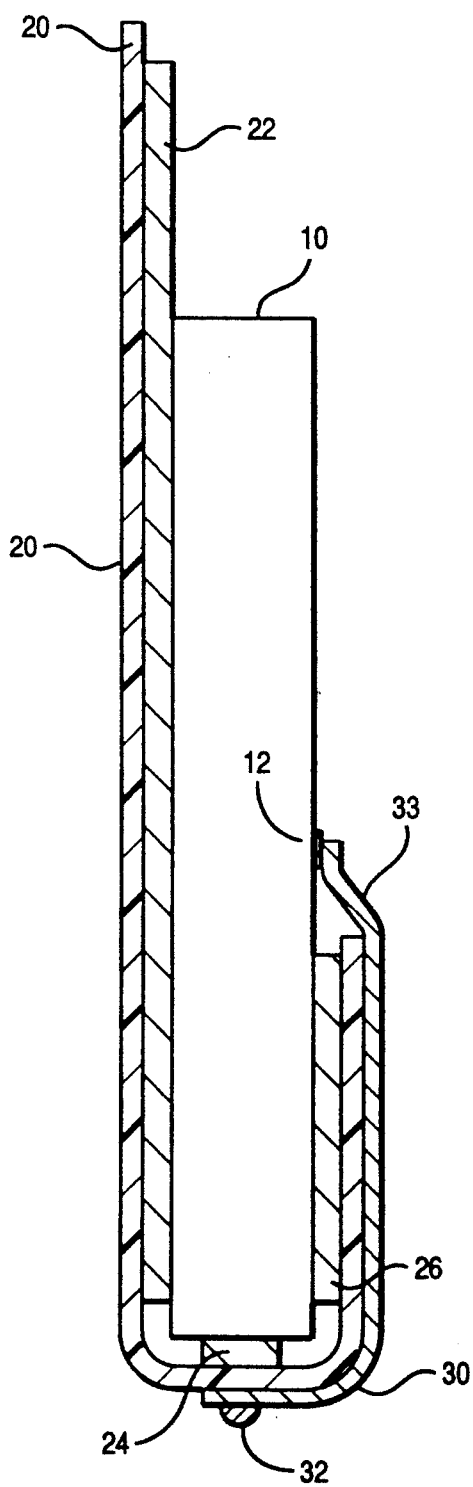
FIG. 9 is another embodiment of the present invention wherein the electrical connection is made using tape automated bonding techniques.

Other embodiments of the present invention will now be described beginning with reference to FIG. 9. Basically, the following embodiments will describe an overlay element capable of being electrically connected to chip 10 without the need for using wire bonding technology. The chip overlay element of FIG. 9 is fabricated similarly to the overlay element fabricated by the process described with reference to FIGS. 3-5. However, subsequent to the circuitization of signal lines 30 on flexible substrate 20, the end of portion of substrate 20 adjacent lines 30 is removed such that circuit lines 30 extend past the end of substrate 20. These circuit line extensions 33 are flexible and then attached to the I/O pads 12 of chip 10 by techniques commonly used in tape automated bonding technology (TAB), e.g. hot bar reflow, ultra sonic welding, thermal welding, or the like. Thus, it can be seen how the chip overlay element can be affixed to chip 10 and electrically connected thereto using TAB technology rather than the wire bonding described with reference to FIGS. 1-8.

Figure 10:
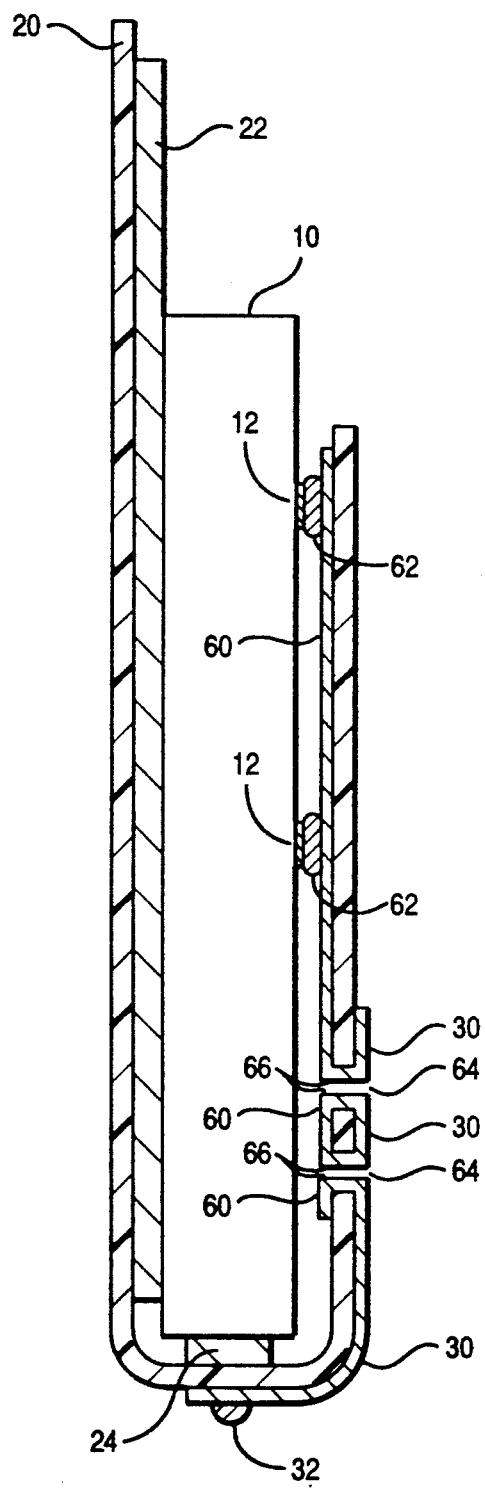
FIG. 10 is another embodiment with the overlay element having two signal planes and the electrical connection is made through the annulus of a via.
Figure 11:
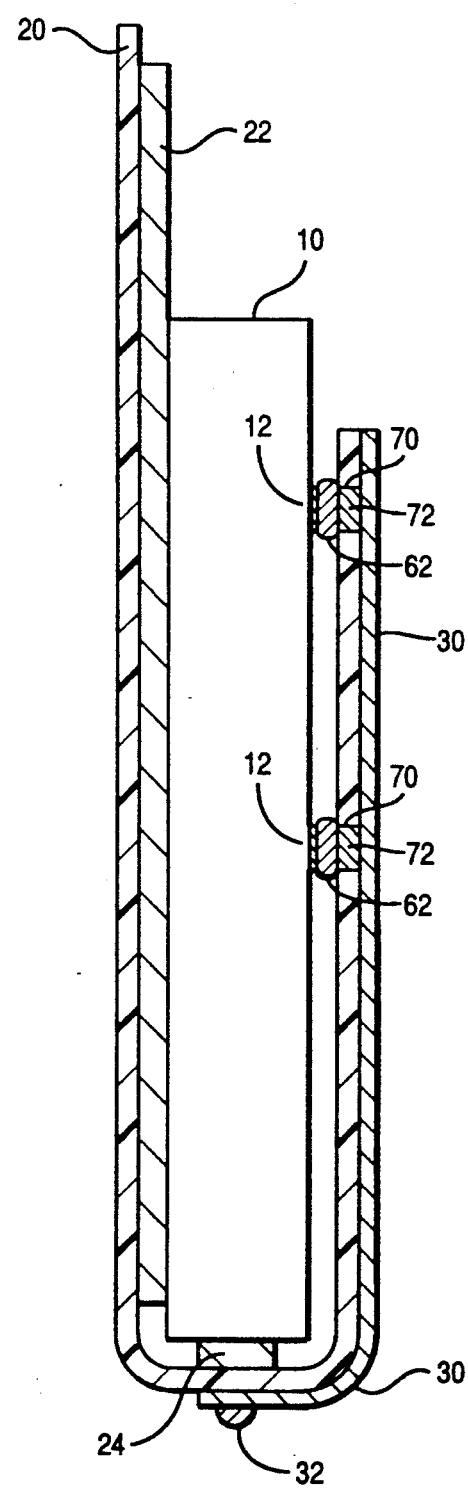
FIG. 11 is yet another embodiment with a single signal plane overlay element interconnected to the chip I/Os through a metallized via.

Referring to FIG. 10, the flexible polymer substrate 20 is shown disposed around chip 10 having only heat spreader 22 and overlay I/O back-up 24 adjacent chip 10. It can be seen that two signal layers are present on each side of substrate 20. Circuitized lines 30 and C4 I/O 32 are present and extend along the outside of flexible substrate 20. Inner circuitized lines 60 are shown on the inside of substrate 20 and extending a sufficient distance to overlap and align with outside circuit lines 30. Vias 64 are formed through both circuitized lines 30, 60 and substrate 20. Electrical conductive material 66 is then placed around the annulus of vias 64 by plating, electrodeposition, or the like. Thus, it can be seen that circuit lines 60 are in electrical communication with corresponding ones of circuit lines 30 through the electrically conductive annulus 66 of vias 64. It should be noted that vias 64 can be formed in lines 30, 60 and substrate 20 by means known in the art such as laser ablation, punching, drilling, chemical etching, or the like. Next C4 solder balls 62 are placed either on chip I/O pads 12, or inner circuitized lines 60. Pads 12 and corresponding circuitized lines 60 are then aligned and pressed together with C4 solder ball 62 intermediate therebetween. Of course, methods other than C4 technology can be used to join the overlay (circuit lines 60) with pads 12, such as pad-to-pad joining techniques using appropriate joining metallurgy. Subsequent to the connection of pads 12 with circuitized lines 60 it can be seen how pads 12 are now in electrical communication with corresponding overlay I/O bumps 32 through inner circuitized lines 60 through via annulus 66 and outer circuitized lines 30. Another embodiment of the present invention is shown in FIG. 11, wherein a single signal plane overlay element is used. Again, flexible substrate 20 is shown with heat spreader 22 and overlay bump I/O portion 24 attached thereto and adjacent chip 10. Circuitized lines 30 are formed as previously described along the outside of substrate 20 and extend to the end thereof, as shown in FIG. 11. Solid vias 70 are formed within substrate 20 and filled with electrically conductive material 72. In a preferred embodiment vias 70 are in fact a pattern of holes corresponding to the chip I/O pads 12 and are laser ablated, or chemically removed from polymer carrier substrate 20 directly beneath circuit lines 30 of the overlay element. That is, the vias are formed after circuit lines 30 are placed on flexible substrate 20. The appropriate joining metallurgy 72, such as solder or the like, is then plated or otherwise disposed in via 72. Again, C4 joining technology can be used as shown by bumps 62 to electrically connect chip pads 12 with joining metallurgy 72 of via 70. In this embodiment electrical connection is made from chip pads 12 through C4 bump 62, metallurgy 72 in via 70, circuitized lines 30 to corresponding overlay I/O bumps 32. It should be noted that substrate 20 can also be prepunched with vias 70 and the foil layer 31 subsequently bonded thereto (FIG. 3). However, when using this technique the bonding material, e.g. epoxy, enters via 70 and must be removed prior to placing conductive material 72 therein.

Figure 12:
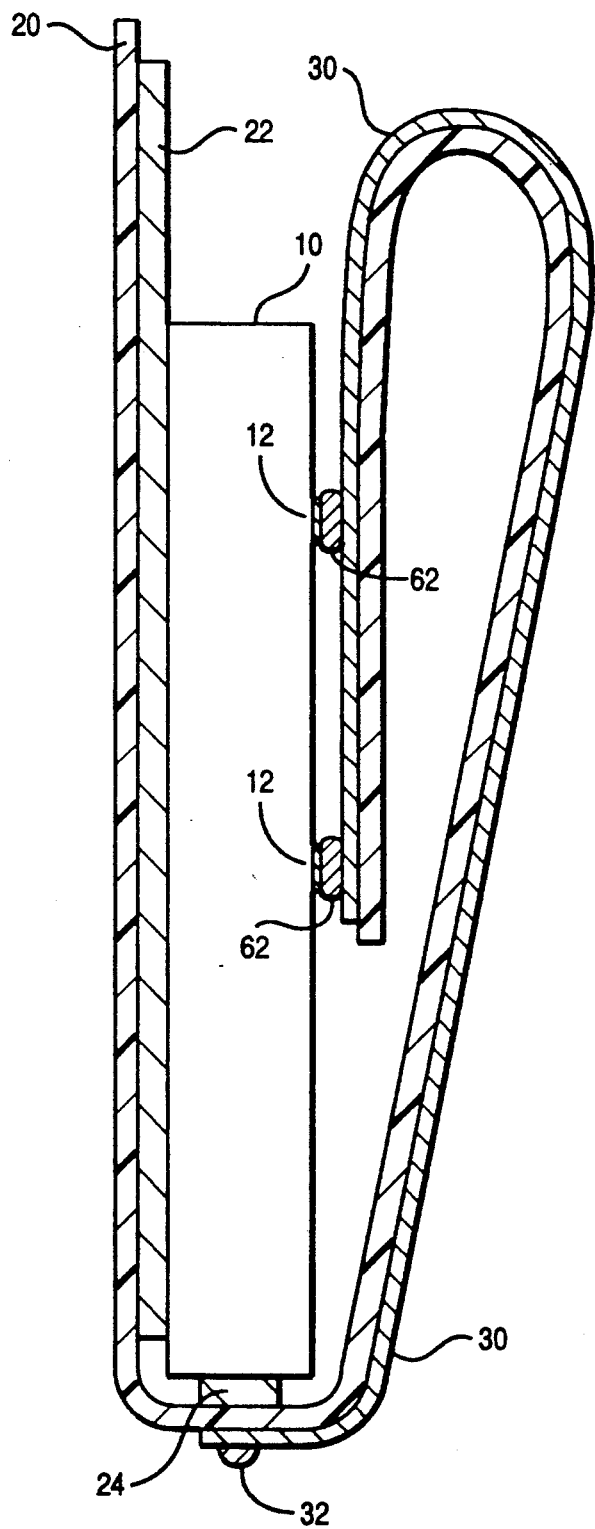
FIG. 12 is another embodiment with an elongated overlay element including a single circuitized layer bent back on itself to interconnect with the chip I/Os.

FIG. 12 shows flexible substrate 20 with heat spreader 22 and overlay bump portion 24 attached thereto and adjacent to chip 10. In the embodiment of FIG. 12, substrate 20 is extended a sufficient distance such that the overlay element can be wrapped around and the circuitized lines 30 on the outside thereof will now be adjacent pads 12 of chip 10. Thus, a single signal plane overlay element can be fabricated as described previously and appropriate joining metallurgy, such as C4 bumps 62 can be placed on circuitized lines 30 such that when the overlay element is wrapped around they will correspond to pads 12 on chip 10. Alternatively, C4 bumps 62 can be placed on pads 12 such that when the overlay element is wrapped around and circuitized lines 30 are adjacent pads 12, bumps 62 will be aligned with appropriate corresponding circuitized lines 30. In this manner, it can be seen that chip I/O pads 12 are connected to corresponding ones of overlay I/O bumps 32 through C4 bumps 62 and corresponding circuitized lines 30.

Therefore, it can be seen that the present invention describes an overlay element capable of reconfiguring the I/Os of an integrated circuit device such that the chip I/Os are then aligned along the edge of the chip-/overlay element assembly. In this manner, high density packaging of integrated circuits is possible using I/Cs having differently configured I/O connection points. The present invention is particular useful in high density memory packaging, but is not limited thereto and is applicable to any type of chip packaging wherein the original chip I/Os must be reconfigured.

Although certain preferred embodiments have been shown and described, it should be understood that many changes and modifications can be made therein without departing from the scope of the appended claims.

We claim:

1. An apparatus for reconfiguring the input/output connection points of an associated integrated circuit device, comprising:
    a substrate, including a support means, that contacts at least two surfaces of an integrated circuit device;
    input/output means for providing electrical connections to said substrate disposed on a first surface of said substrate opposite said support means; and
    electrical connection means for interconnecting the input/output connection point included on an integrated circuit with said input/output means.

2. An apparatus according to claim 1 wherein said electrical connection means comprises circuitized electrical signal lines interconnected with said input/output means and disposed on said first substrate surface.

3. An apparatus according to claim 1 wherein said support means comprises:
    first means for supporting said substrate input/output means; and
    second means for supporting said substrate, and for transferring heat away from an associated integrated circuit device.

4. An apparatus according to claim 3 wherein said electrical connection means further comprises:
    electrical connection pads in electrical communication with said signal lines and disposed on an end thereof opposite of said input/output means; and
    electrical conductors intermediate said electrical connection pads and associated integrated circuit device input/output connection points.

5. An apparatus according to claim 4 wherein said electrical connection pads comprise joining metallurgy compatible with wire bonded lines.

6. An apparatus according to claim 5 wherein said support means further comprises third means for supporting said electrical connection pads.

7. An apparatus according to claim 3 wherein said signal lines extend beyond said substrate and directly interconnect input/output connection points on an integrated circuit.

8. An apparatus according to claim 3 wherein said electrical connection means further comprises:
    electrical signal lines formed on a second surface of said substrate opposite said first surface and adjacent corresponding input/output connection points of an associated integrated circuit;
    a plurality of visa formed through said substrate and corresponding one of said signal lines formed on respective first and second surfaces of said substrate;
    electrically conductive material formed around an annulus of said vias for electrically interconnecting said corresponding one of said signal lines formed on said respective first and second surfaces; and
    means for electrically interconnecting said signal lines on said second surface with input/output connection points on an associated integrated circuit.

9. An apparatus according to claim 3 wherein said electrical connection means further comprises:
    a plurality of vias, formed through said substrate and adjacent input/output connecting points on an associated integrated circuit;
    electrically conductive material within said vias and in electrical contact with a corresponding one of said signal lines; and
    means for interconnecting said vias with a corresponding input/output connection points on an associated integrated circuit.

10. An apparatus according to claim 3 wherein said electrical connection means further comprises means for directly interconnecting said signal lines with input/output connection points on an associated integrated circuit by extending said substrate having said signal lines thereon such that the substrate is bent and the signal liens will face the connection points of the associated integrated circuit.

11. An apparatus according to claim 3 further comprising means for holding an associated integrated circuit device with reconfigured input/output connecting points such that the associated integrated circuit device is in electrical communication with other electronic components in a computer system.

12. A method for reconfiguring the input/output connection points of an integrated circuit device, comprising the steps of:
    disposing electrical input/output connection means on a first surface of a substrate for providing electrical connections thereto;
    placing said substrate surface, including a support means opposite said first surface, in a position so that said support means contacts at least two surfaces of an associated integrated circuit device; and
    electrically interconnecting input/output connection points of an integrated circuit with said substrate input/output connection means.

13. A method according to claim 12 wherein said step of interconnecting comprises the steps of:
    forming circuitized electrical signal lines of said firs substrate surface; and
    interconnecting said signal lines with input/output connection points of an associated integrated circuit.

14. A method according to claim 12 wherein said step of supporting comprises the steps of:
    supporting said substrate input/output connection means; and
    transferring heat away form an associated integrated circuit device.

15. A method according to claim 14 further comprising the step of holding an associated integrated circuit device with reconfigured input/output connection points such that the associated integrated circuit device is in electrical communication with other electronic components in a computer system.

* * * * *